(12) United States Patent
Wakita et al.

(10) Patent No.: US 6,334,603 B1
(45) Date of Patent: Jan. 1, 2002

(54) MOLD FOR PRODUCING SILICON INGOT AND METHOD FOR FABRICATING THE SAME

(75) Inventors: Saburo Wakita; Akira Mitsuhashi; Jun-ichi Sasaki, all of Omiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/258,821

(22) Filed: Feb. 26, 1999

(30) Foreign Application Priority Data

Feb. 26, 1998 (JP) ............................. 10-045460
Feb. 27, 1998 (JP) ............................. 10-047449

(51) Int. Cl.$^7$ ................................. B22D 7/06
(52) U.S. Cl. ................. 249/112; 106/38.27; 249/114.1; 249/134; 249/174
(58) Field of Search ................. 249/112, 114.1, 249/134, 174; 106/38.27

(56) References Cited

U.S. PATENT DOCUMENTS

| 3,396,935 A | * | 8/1968 | Snyder ................. 249/174 |
| 3,682,435 A | * | 8/1972 | Loftberg et al. ........... 249/174 |
| 4,548,381 A | * | 10/1985 | Mabie, Jr. et al. ........ 249/114.1 |
| 4,683,937 A | * | 8/1987 | Hamill, Jr. et al. ........ 249/174 |
| 4,740,246 A | * | 4/1988 | Feagin ................. 249/114.1 |

* cited by examiner

*Primary Examiner*—James P. Mackey
(74) *Attorney, Agent, or Firm*—Oblon, Spivak, McClelland, Maier & Neustadt, P.C.

(57) ABSTRACT

A mold for producing a silicon ingot having a layered structure comprising an inner silica layer containing at least one layer in which a fused silica powder with a particle size of 100 μm or less and a fine fused silica sand with a particle size of 100–300 μm is bonded with a silica binder, and an outer silica layer containing at least one layer in which a fused silica powder with a particle size of 100 μm or less and a coarse fused silica sand with a particle size of 500–1500 μm is bonded with a silica binder.

13 Claims, 9 Drawing Sheets

MOLD FOR PRODUCING SILICON INGOT AND METHOD FOR FABRICATING THE SAME

BACKGROUND OF THE INVENTION

1. Field of the Invention

The present invention relates to a mold for producing a silicon ingot for use in producing a polycrystalline silicon ingot to be used for a silicon substrate for a photovoltaic solar cell, and to a method for fabricating the same. The present invention especially relates to a mold for producing a silicon ingot having an inner silica layer, or an inner silica layer and outer silica layer, being free from crack due to inner stress caused by cooling after solidification of the molten silicon, and a method for fabricating the same.

2. Description of the Related Art

A quartz mold or a graphite mold has been used as a mold for producing a silicon ingot. The quartz mold is fabricated by the steps comprising: preparing fused silica powder, filling the fused silica powder into a cavity of a graphite mold comprising an inner mold and outer mold having a cavity with the same shape as the mold; rotating the outer mold while firing a burner flame on the fused silica powder adhered on inner side wall of the outer mold after removing the inner mold; and forming the silica powder into a mold shape while the powder is melting. The cross section of the conventional quartz mold fabricated as described above is shown in FIG. 9. Otherwise, the graphite mold is fabricated by assembling graphite plates. Because detachability of the ingot from the mold is so poor, sometimes causing cracks in the ingot, when the mold is directly used after fabrication that the surface of the mold should be treated with an inert coating substance. Accordingly, the inside wall of the mold is coated with a slurry prepared by mixing a powder of silicon dioxide ($SiO_2$), silicon carbide (SiC), silicon nitride ($Si_3N_4$), or yttrium oxide ($Y_2O_3$) with 4% aqueous polyvinyl alcohol solution as a release agent at a thickness of 0.5 mm or less.

However, the silicon ingot 2 is subjected to heat-shrink when the molten silicon is cooled in the quartz mold 1. Since the silicon ingot is heat-shrunk along the direction indicated by S in FIG. 9 while remaining to be adhered to the wall face of the quartz mold 1, the outer circumference of the silicon ingot 2 suffers a tension at the inner wall of the quartz mold to generate dislocations or cracks due to inner stress inside of the ingot 2. The silicon substrate for use in a photovoltaic solar cell, produced from the silicon ingot having cracks or dislocations, inevitably has poor photovoltaic efficiency.

On the other hand, particles of the release agent freed from the surface of the mold penetrate into the molten silicon when the molten silicon is allowed to stand for a long period of time in the mold coated with the release agent. Consequently, a silicon substrate with excellent photovoltaic conversion efficiency can not be obtained because particles of the release agent are enveloped into the silicon ingot produced using the mold coated with the release agent.

Meanwhile, producing a high purity silicon ingot with a more reasonable production cost is crucial cost down requirements for silicon substrate production.

SUMMARY OF THE INVENTION

Accordingly, the object of the present invention is to provide a silicon ingot with fewer cracks, dislocations and no release agent with reasonable cost than the ingot produced by using the conventional quartz mold.

In one aspect, the present invention provides a mold for producing a silicon ingot having a layered structure comprising an inner silica layer containing at least one layer in which a fused silica powder with a particle size of 100 μm or less and fine fused silica sand with a particle size of 100–300 μm is joined with a silica binder, and an outer silica layer containing at least one layer in which a fused silica powder with a particle size of 100 μm or less and coarse fused silica sand with a particle size of 500–1500 μm is bonded with a silica binder.

In accordance with another aspect, the present invention provides a method for fabricating a mold for producing a silicon ingot having an inner silica layer and an outer silica layer comprising the steps of:

forming a slurry layer on the surface of a wax mold by dipping, followed by lifting up, the wax mold having the same shape as that of the inner shape of the mold for producing a silicon ingot into a slurry comprising fused silica powder and colloidal silica, followed by forming an inner stucco layer by sprinkling fine fused silica sand with a particle size of 100–300 μm on the surface of the slurry layer;

forming an outer stucco layer on the inner stucco layer by sprinkling coarse fused silica sand with a particle size of 500–1500 μm on the surface of the slurry layer after forming the slurry layer by further dipping, followed by lifting up, the wax mold on which the inner stucco layer has been formed into a slurry comprising the fused silica powder and colloidal silica; and heat-melting and eliminating the wax mold along with baking the inner stucco layer and outer stucco layer.

DESCRIPTION OF THE PREFERRED EMBODIMENT

Figure 1:
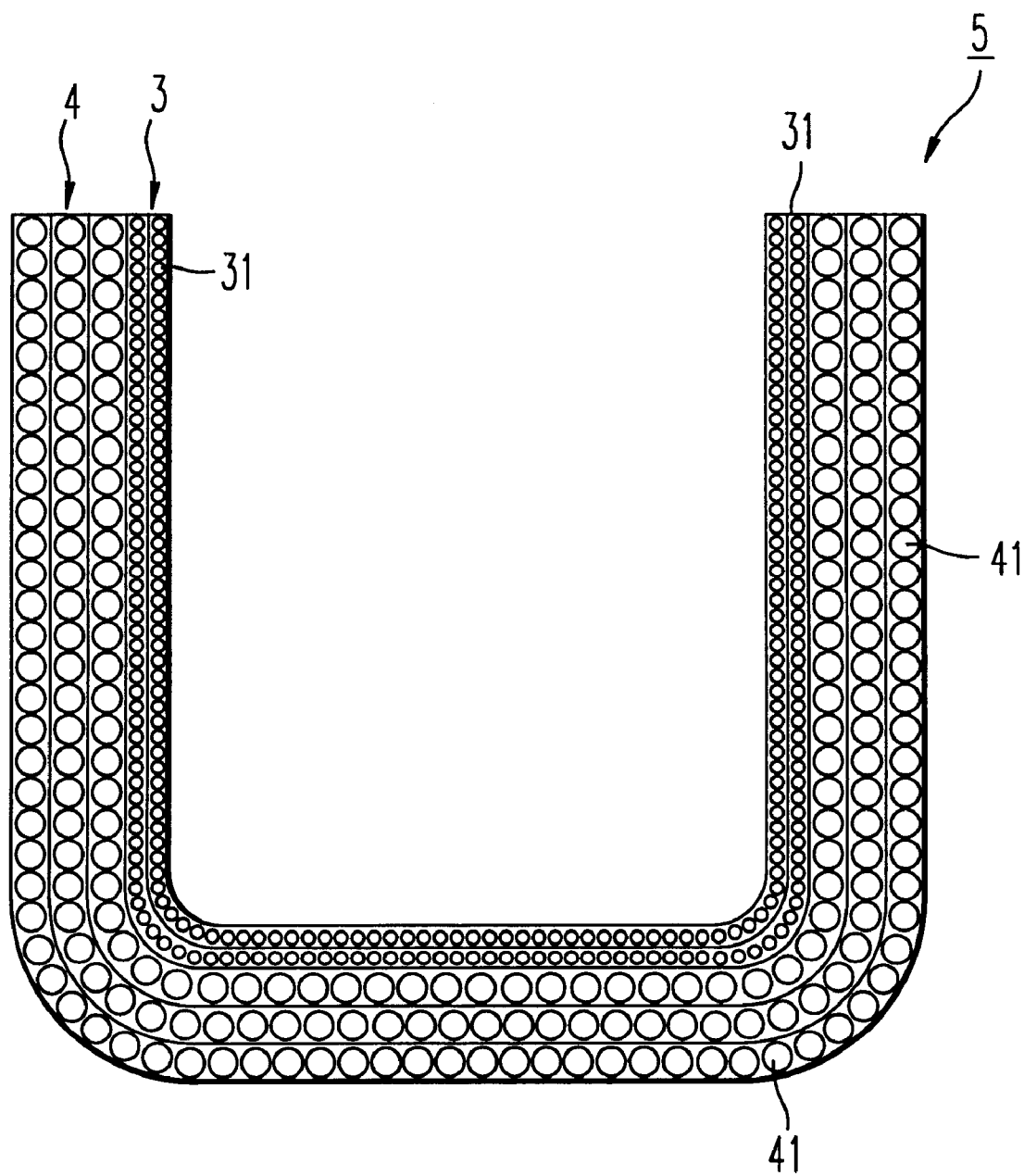
FIG. 1 denotes an illustrative cross section of the mold for producing a silicon ingot according to the present invention.
Figure 2:
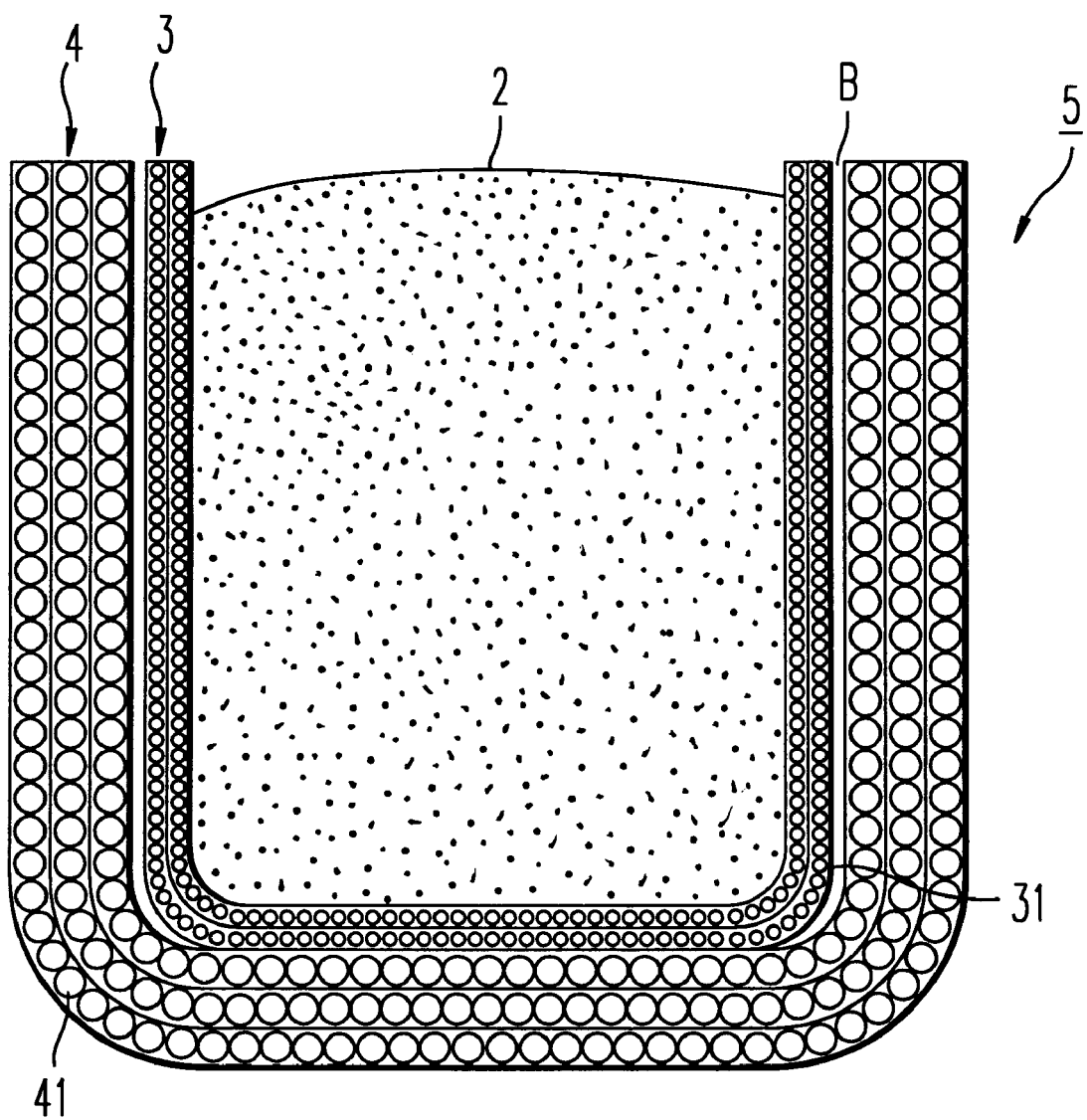
FIG. 2 denotes an illustrative cross section showing the solidified silicon ingot by cooling after injecting a molten silicon into the mold for producing a silicon ingot according to the present invention.

The mold 5 for producing a silicon ingot as shown in the cross section in FIG. 1 has a layered structure comprising an inner silica layer 3 containing at least one layer in which a fused silica powder (not shown in the drawing) with a particle size of 100 $\mu$m or less and a fine fused silica sand 31 with a particle size of 100–300 $\mu$m are joined with a binder, and an outer silica layer 4 containing at least one layer in which a fused silica powder with a particle size of 100 $\mu$m or less and a coarse fused silica sand 41 with a particle size of 500–1500 $\mu$m is bonded with a silica binder. The inner silica layer 3 containing the fused silica sand 31 having fine particle size is readily released from the outer silica layer 4 containing silica sand 41 having coarse particle size. The inner silica layer 3 is released from the outer silica layer 4 by being adhered to the silicon ingot 2 when the periphery of the silicon ingot 2 is pulled toward the inner wall face of the mold as shown in FIG. 2 by shrinkage of the mold while the molten silicon poured into the cavity of the mold 5 for producing the silicon ingot is cooled after solidification. Accordingly, neither inner stress nor cracks and dislocations as seen in the ingot obtained using the conventional mold occur in the solidified silicon ingot.

Figure 3:
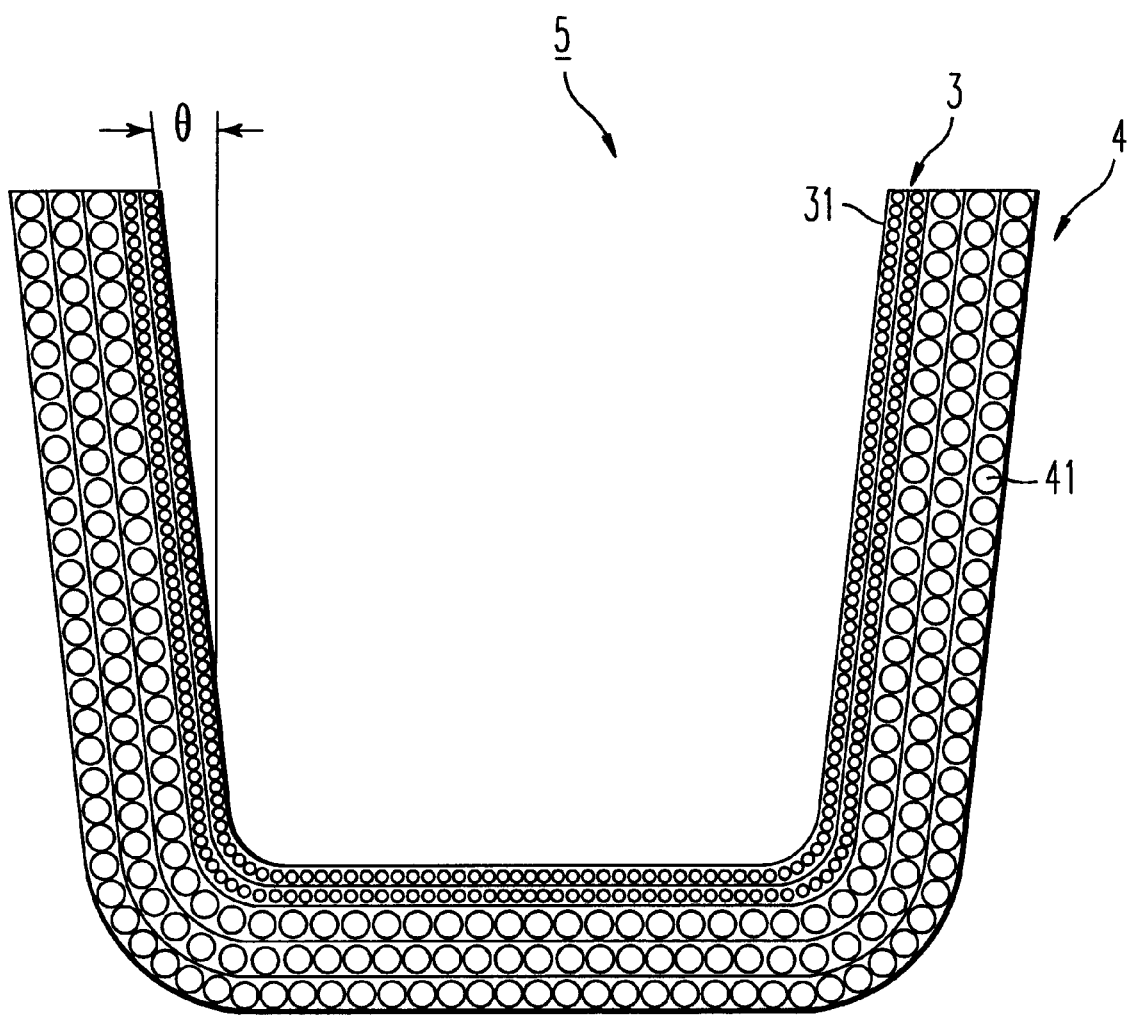
FIG. 3 denotes an illustrative cross section of the mold for producing a silicon ingot according to the present invention.

The mold for producing a silicon ingot—having a layered structure comprising an inner silica layer 3, containing at least one layer in which the fused silica powder (not shown in the drawing) with a particle size of 100 $\mu$m or less and the fine fused silica sand 31 with a particle size of 100–300 $\mu$m are joined with a binder, and an outer silica layer 4 containing at least one layer in which the fused silica powder with a particle size of 100 $\mu$m or less and the coarse fused silica sand 41 with a particle size of 500–1500 $\mu$m is bonded with a silica binder—is tapered from the bottom toward the opening so that the opening area becomes larger than the bottom area as shown in the cross section in FIG. 3. Because the stress generated in the silicon ingot is more reduced, a large grain size silicon ingot with few cracks and dislocations can be produced.

The inner space of the mold for producing the silicon ingot—having a layered structure comprising the inner silica layer 3 containing at least one layer in which the fused silica powder (not shown in the drawing) with a particle size of 100 $\mu$m or less and the fine fused silica sand 31 with a particle size of 100–300 $\mu$m are bonded with a binder, and an outer silica layer 4 containing at least one layer in which the fused silica powder with a particle size of 100 $\mu$m or less and the coarse fused silica sand 41 with a particle size of 500–1500 $\mu$m is bonded with a silica binder—may have not only a circular cross section but also a polygonal cross section.

Since the coarse fused silica sand never makes a direct contact with the molten silicon, a used fused silica sand or a low purity fused silica sand may be used.

Since the released silica sand has a smaller specific gravity than the molten silicon, the former is released to outside as SiO gas by reacting with the molten silicon after being separated on the surface of the molten silica, leaving no defects within the silicon ingot.

The mold for producing the silicon ingot, based on the concept as hitherto described, has a layered structure comprising an inner silica layer containing at least one layer in which a fused silica powder with a particle size of 100 $\mu$m or less and a fine fused silica sand with a particle size of 100–300 $\mu$m is bonded with a silica binder, and an outer silica layer containing at least one layer in which a fused silica powder with a particle size of 100 $\mu$m or less and a coarse fused silica sand with a particle size of 500–1500 $\mu$m is bonded with a silica binder.

The wall face of the inner space of the mold for producing a silicon ingot is tapered from the bottom to the opening so that the opening area becomes larger than the bottom area.

The mold for producing a silicon ingot has an inner space whose horizontal cross section assumes a circle or a polygon.

The wall face of the inner space of the mold for producing a silicon ingot is tapered from the bottom toward the opening so that the opening area becomes larger than the bottom area and the mold has an inner space whose horizontal cross section assumes a circle or a polygon.

The method for fabricating a mold for producing a silicon ingot, based on the concept as hitherto described, having an inner silica layer and an outer silica layer comprises the steps of:

forming a slurry layer on the surface of a wax mold by immersing, followed by lifting up, the wax mold having the same shape as that of the inner space of the mold for producing a silicon ingot into a slurry comprising fused silica powder and colloidal silica, followed by forming an inner stucco layer by sprinkling a fine fused silica sand with a particle size of 100–300 $\mu$m on the surface of the slurry layer;

forming an outer stucco layer on the inner stucco layer by sprinkling the coarse fused silica sand with a particle size of 500–1500 $\mu$m on the surface of the slurry layer after forming the slurry layer by further dipping, followed by lifting up, the wax mold on which the inner stucco layer has been formed into a slurry comprising the fused silica powder and colloidal silica; and heat-melting and eliminating the wax mold along with by baking the inner stucco layer and outer stucco layer.

The method for fabricating a mold for producing a silicon ingot having an inner silica layer and an outer silica layer comprises the steps of:

forming a slurry layer on the surface of a wax mold by dipping, followed by lifting up, a wax mold having the same shape as that of the inner shape of the mold for producing, a silicon ingot into a Slurry comprising a fused silica powder and a colloidal silica, at least one layer of an inner stucco layer being, formed by applying at least one process for forming the inner stucco layer by sprinkling a fine fused silica sand with a particle size of 100–300 $\mu$m on the surface of the slurry layer;

forming at least one outer stucco layer on the inner stucco layer by applying at least one process for forming an outer stucco layer by sprinkling the coarse fused silica sand with a particle size of 500–1500 $\mu$m on the surface of the slurry layer after forming the slurry layer by further dipping, followed by lifting up, the wax mold on which the inner stucco layer has been formed into a slurry comprising the fused silica powder and colloidal silica; and heat-melting and eliminating the wax mold along with baking the inner stucco layer and outer stucco layer.

In the method for fabricating a mold for producing a silicon ingot as hitherto described, the wall face of the wax mold is tapered from the bottom toward the top so that the top area becomes larger than the bottom area.

In the method for fabricating a mold for producing a silicon ingot, the wall face of the wax mold is tapered from the bottom toward the top so that the top area becomes larger than the bottom area and the wax mold has a horizontal cross section assuming a circle or a polyoil.

The particle size of the fused silica sand contained in the inner layer of the mold for producing a silicon ingot according to the present invention was limited to 100 µm or less because the fused silica powder mixed with the colloidal silica is precipitated and it becomes difficult to uniformly disperse the fused silica powder when the fused silica powder has a coarse particle size of 100 µm or more.

The particle size of the fine fused silica sand contained in the inner silica layer is limited in the range of 100–300 µm because the inner silica layer becomes difficult to release from the outer silica layer when the fine silica sand has a particle size as coarse as more than 300 µm while, when the fine fused silica sand contained in the inner layer has a particle size as fine as less than 50 µm, the inner silica layer becomes so readily peeled that it is released while producing the mold. In addition, the particle size of the coarse fused silica sand contained in the outer silica layer of the mold for producing a silicon ingot according to the present invention is limited in the range of 500–1500 µm because, when the coarse fused silica sand has a particle size as coarse as more than 1500 µm, the specific gravity of the mold is decreased thereby lowering its strength while, when the coarse fused silica sand has a particle size as line as less than 500 µm, the strength of the outer silica layer is lowered along with deteriorating detachability of the outer silica layer from the inner silica layer.

As shown in FIG. 3, the mold for producing the silicon ingot according to the present invention has a layered structure comprising an inner silica layer containing at least one layer in which a fused silica powder with a particle size of 100 µm or less and a fine fused silica sand with a particle size of 100–300 µm is bonded with a silica binder, and an outer silica layer containing at least one layer in which a fused silica powder with a particle size of 100 µm or less and a coarse fused silica sand with a particle size of 500–1500 µm is bonded with a silica binder. It is preferable to provide a taper angle θ at the wall face of the inner shape of the mold for producing the silicon ingot from the bottom toward the opening so that the opening, area becomes larger than the bottom area since the grain size can be developed coarse during solidification of the molten silicon owing to an expanded cross section at the solidification boundary. The taper angle is preferably in the range of 1–5° C.

It is preferable that the inner silica layer, containing at least one layer in which a fused silica powder with a particle size of 100 µm or less and a fine fused silica sand with a particle size of 100–300 µm is bonded with a silica binder, has a thickness that allows the inner silica layer to be released by shrinking of the silicon ingot during solidification. The preferred thickness is in the range of 0.1–5 mm. Also, the outer silica layer, containing at least one layer in which the fused silica powder with a particle size of 100 µm or less and the coarse fused silica sand with a particle size of 500–1500 µm are bonded with a binder, is required to have a thickness of about 5 mm for maintaining the strength of the mold in producing the silicon ingot. However, since too thick layer results in high production cost, the practical thickness is preferably in the range of 3–20 mm.

The inner silica layer constructing the mold for producing the ingot according to the present invention is formed by forming a slurry layer on the surface of a wax mold by dipping, followed by lifting up, a wax mold having the same shape as that of the inner shape of the mold for producing a silicon ingot into a slurry comprising a fused silica powder and colloidal silica, at least one layer of the inner stucco layer being formed by applying at least one process for forming the inner stucco layer by sprinkling the fine fused silica sand with a particle size of 100–300 µm on the surface of the slurry layer. The outer silica layer constructing the mold for producing the ingot according to the present invention is formed by forming at least one outer stucco layer on the inner stucco layer by applying at least one process for forming an outer stucco layer by sprinkling the coarse fused silica sand with a particle size of 500–1500 µm on the surface of the slurry layer after forming the slurry layer by further dipping, followed by lifting up, the wax mold on which the inner stucco layer has been formed with a slurry comprising the fused silica powder and colloidal silica.

Figure 4:
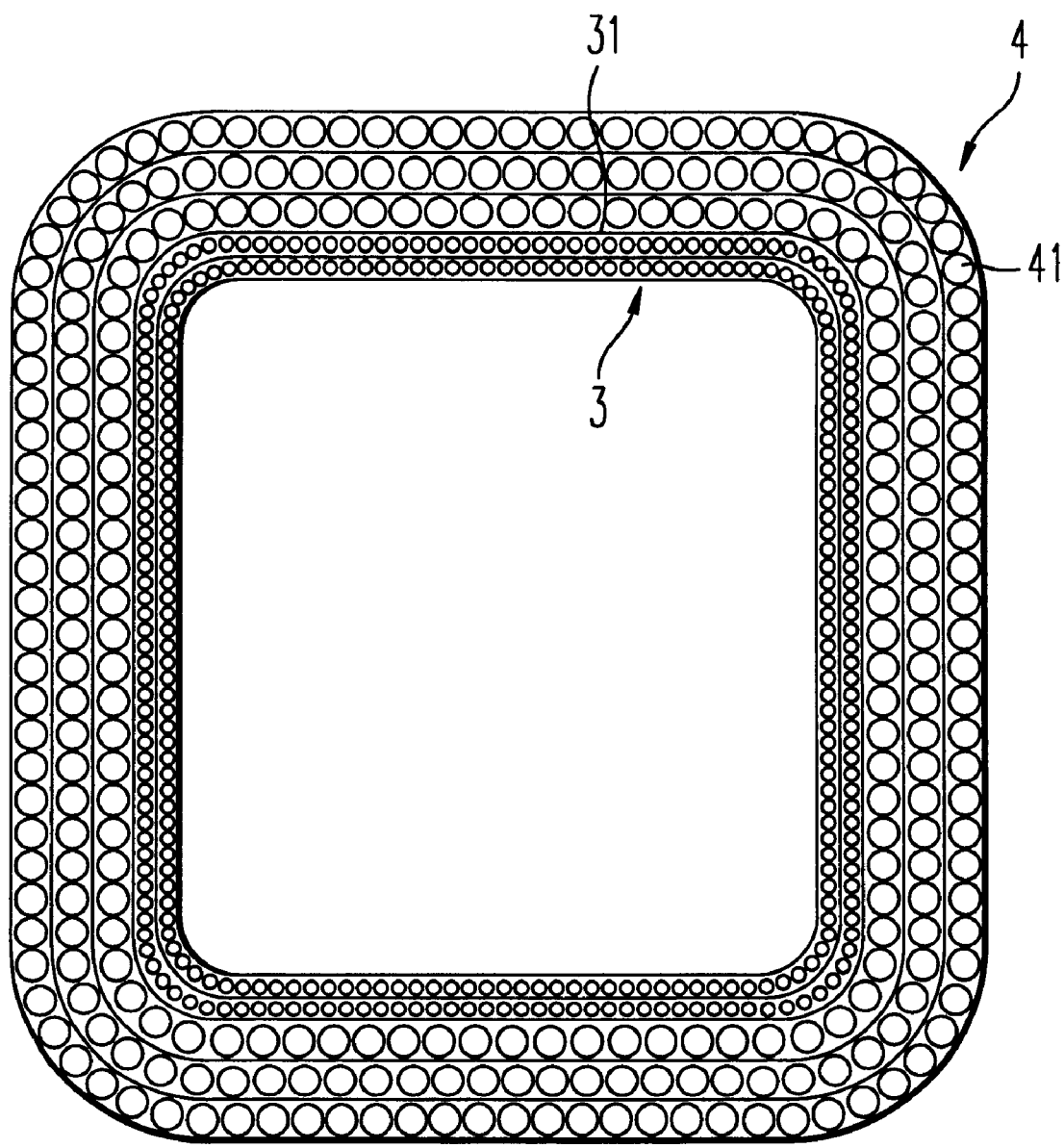
FIG. 4 denotes a horizontal cross section of the mold for producing a silicon ingot according to the present invention having an inner space in the mold at an arbitrary height.

The inner shape of the mold for producing the silicon ingot according to the present invention can be not only fabricated to be a conventional circle, but also to be polygonal in its horizontal cross-section at an arbitrary height of the mold for producing the silicon ingot as shown in FIG. 4.

The mold for producing the silicon ingot according to the present invention having a space with an arbitrary size and shape of the mold (for example, a circular column, a hexagonal column, a cubic or a rectangular column) is fabricated by the steps comprising: fabricating a wax mold having an arbitrary size and shape (for example, a circular column, a hexagonal column, a cube and a rectangular column); forming a slurry layer on the surface of the wax mold by dipping, followed by lifting up, the wax mold into a slurry comprising a fused silica powder with a particle size of 100 mm or less and a colloidal silica; sprinkling a fine fused silica sand with a particle size of 100–300 µm on the surface of the slurry layer; forming an inner silica layer by applying at least one process for forming an outer stucco layer; forming a surface slurry layer of the inner silica layer by dipping, followed by lifting up, the wax mold (having a shape of a circular column, hexagonal column, cube or rectangular column) after forming the inner silica layer into a slurry comprising fused silica powder with a diameter of 100 µm and colloidal silica; sprinkling coarse fused silica sand with a particle size of 500–1500 µm on the surface of the slurry layer; and forming the outer silica layer by applying at least one process for forming the stucco layer.

The inner shape of the silicon ingot having a square or rectangular cross section can be obtained by using the mold for producing the silicon ingot with a cubic or rectangular column inner shape according to the present invention. Using the silicon ingot having a square or rectangular cross section especially for producing a square or rectangular silicon substrate of the photovoltaic solar cell allows the expensive silicon ingot to be effectively utilized. When the square or rectangular silicon substrate for use in the photovoltaic solar cell is produced from the conventional rod-shaped silicon ingot, a silicon disk is firstly produced from the rod-shaped silicon ingot followed by cutting four corners off the silicon disk to form into a square or rectangular silicon substrate for the photovoltaic solar cell, wasting the cut-off portions from the disk. However, when the silicon ingot has a square or rectangular cross section, the silicon plate obtained by slicing the silicon ingot also has a square or rectangular shape, thereby extremely saving the cut-off proportion for producing the square or rectangular silicon substrate for the photovoltaic solar cell enabling to save production costs.

According to the results obtained by the inventors of the present invention, a cheap graphite mold or quartz mold may be used as an outermost core of the mold. A layer comprising an inner silica layer containing at least one layer in which the fused silica powder with a particle size of 100 μm or less and the fine fused silica sand with a particle size of 100–300 μm are bonded with a binder, or a layer comprising the foregoing inner silica layer and an outer silica layer containing at least one layer in which the fused silica powder with a particle size of 100 μm or less and the coarse fused silica sand with a particle size of 500–1500 μm are bonded with a binder, may be formed on the inner face of the graphite or quartz mold described above. Since the graphite mold or the quartz mold serves as a reinforcing outermost core when it is used as an outermost core, the foregoing inner silica layer or a layer comprising the inner silica layer and outer silica layer may be used as an inner layer on the inner face of the graphite mold or quartz mold.

Figure 5:
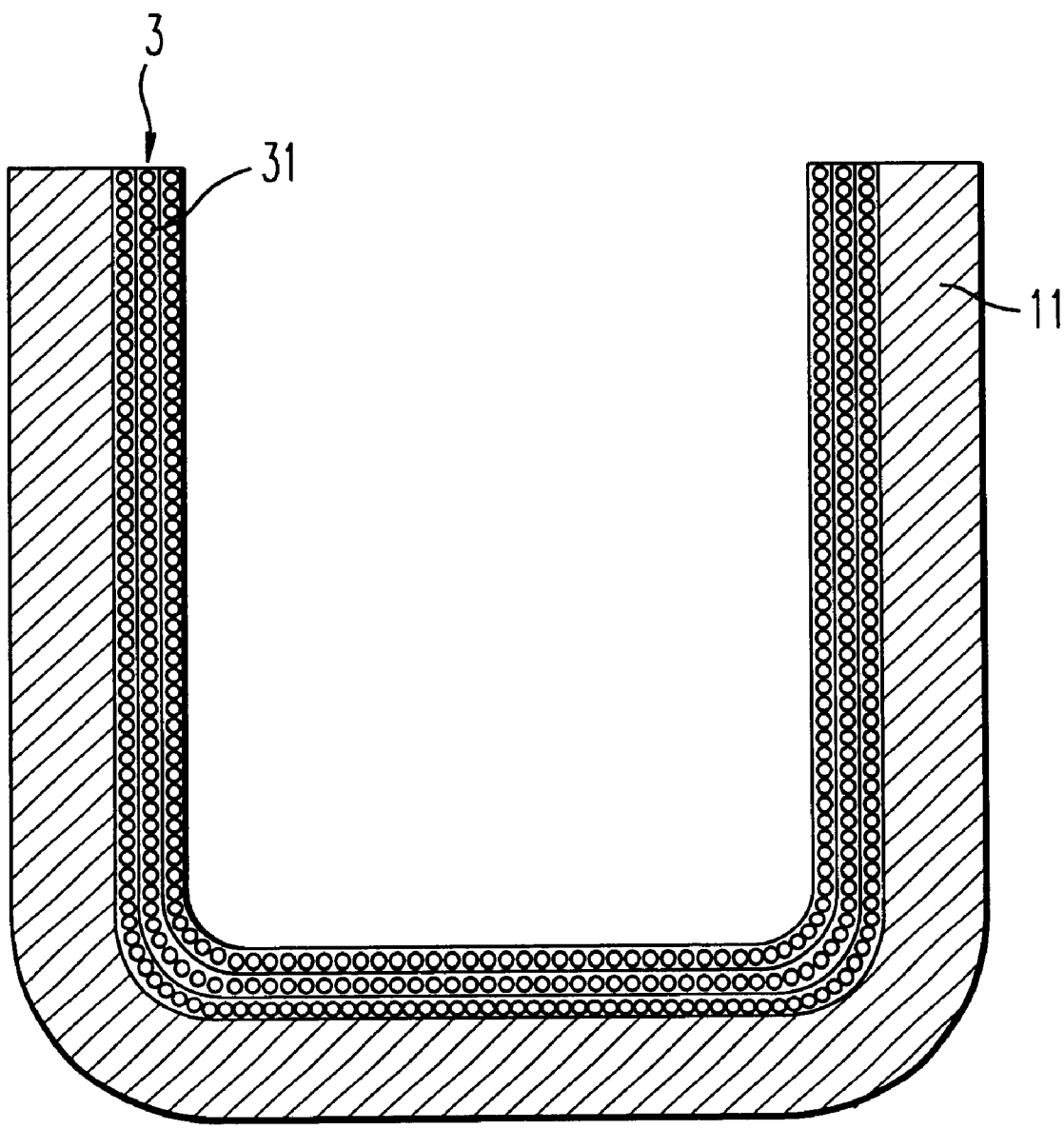
FIG. 5 denotes an illustrative cross section of the mold for producing a silicon ingot according to the present invention.

As shown in the cross section in FIG. 5, the silicon ingot, produced by using a graphite ingot 1 whose inner side is coated with an inner silica layer 3 containing the fused silica powder (not shown in the drawing) with a particle size of 100 μm or less and the fine fused silica sand 31 with a particle size of 100–300 μm, has a purity comparable to the purity of the silicon ingot produced by using the quartz mold, making it possible to obtain a silicon ingot using the graphite ingot having a photovoltaic conversion efficiency as excellent as that of the silicon ingot produced by using a quartz mold.

Figure 6:
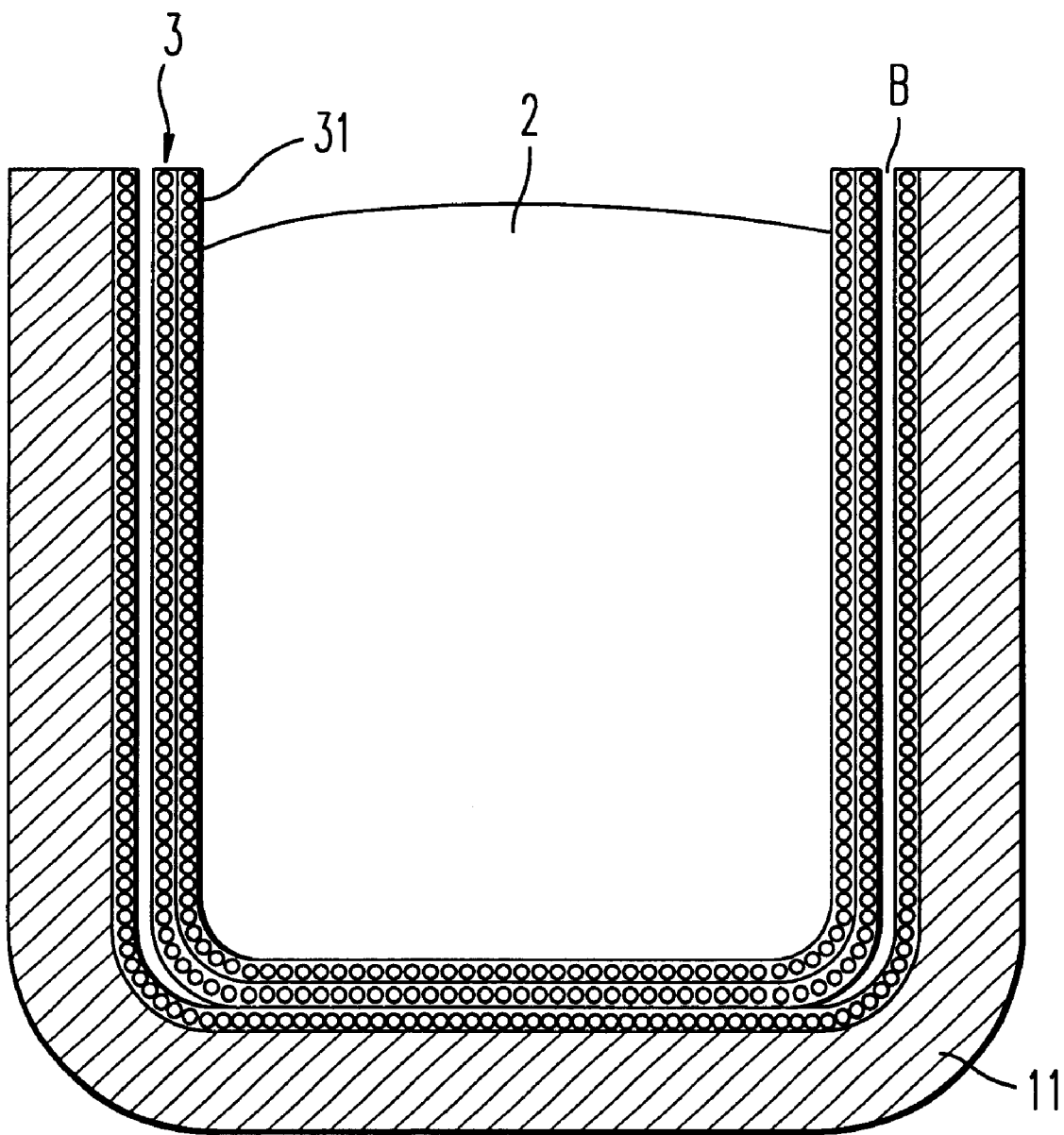
FIG. 6 denotes an illustrative cross section showing the solidified silicon ingot by cooling after injecting a molten silicon into the mold for producing a silicon ingot according to the present invention.

The inner silica layer 3 containing the fine fused silica sand 31 is readily released from the inner wall of the graphite mold 11 in the mold for producing the silicon ingot having the inner silica layer 3 as shown by the cross section in FIG. 5. Accordingly, a peeled portion B appears as shown in the cross section in FIG. 6 by allowing the periphery of the silicon ingot 2 to be pulled by the inner wall of the mold when the solidified silicon ingot shrinks by cooling after the molten silicon is poured into the mold for producing the silicon ingot, thereby leaving no inner stress in the silicon ingot 2. Accordingly, the ingot produced as described above never suffers from cracks due to stress as seen in the ingot produced by using a conventional quartz ingot.

Figure 7:
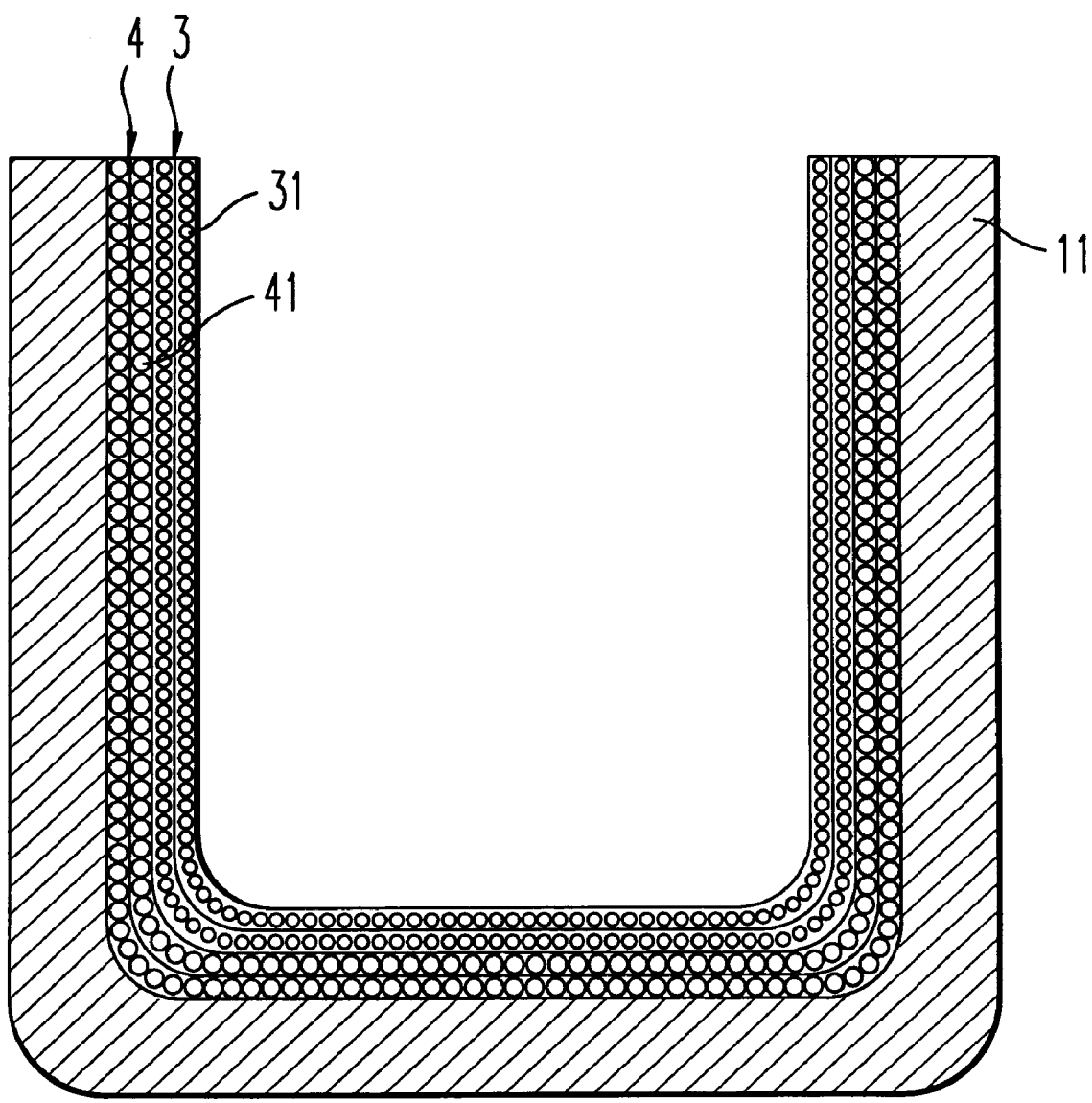
FIG. 7 denotes an illustrative cross section of the mold for producing a silicon ingot according to the present invention.

The silicon ingot, produced by using the graphite mold in which a layer having an outer silica layer 4 containing the fused silica powder (not shown in the drawing) having a particle size of 100 μm or less and the inner silica layer 3 containing the fine fused silica sand having a particle size of 100–300 μm are formed on the inner side of the graphite mold 1 as shown in FIG. 7, has a purity comparable to the purity of the ingot produced by using the quartz mold, enabling to produce a silicon substrate having an excellent photovoltaic conversion efficiency from the silicon ingot.

Figure 8:
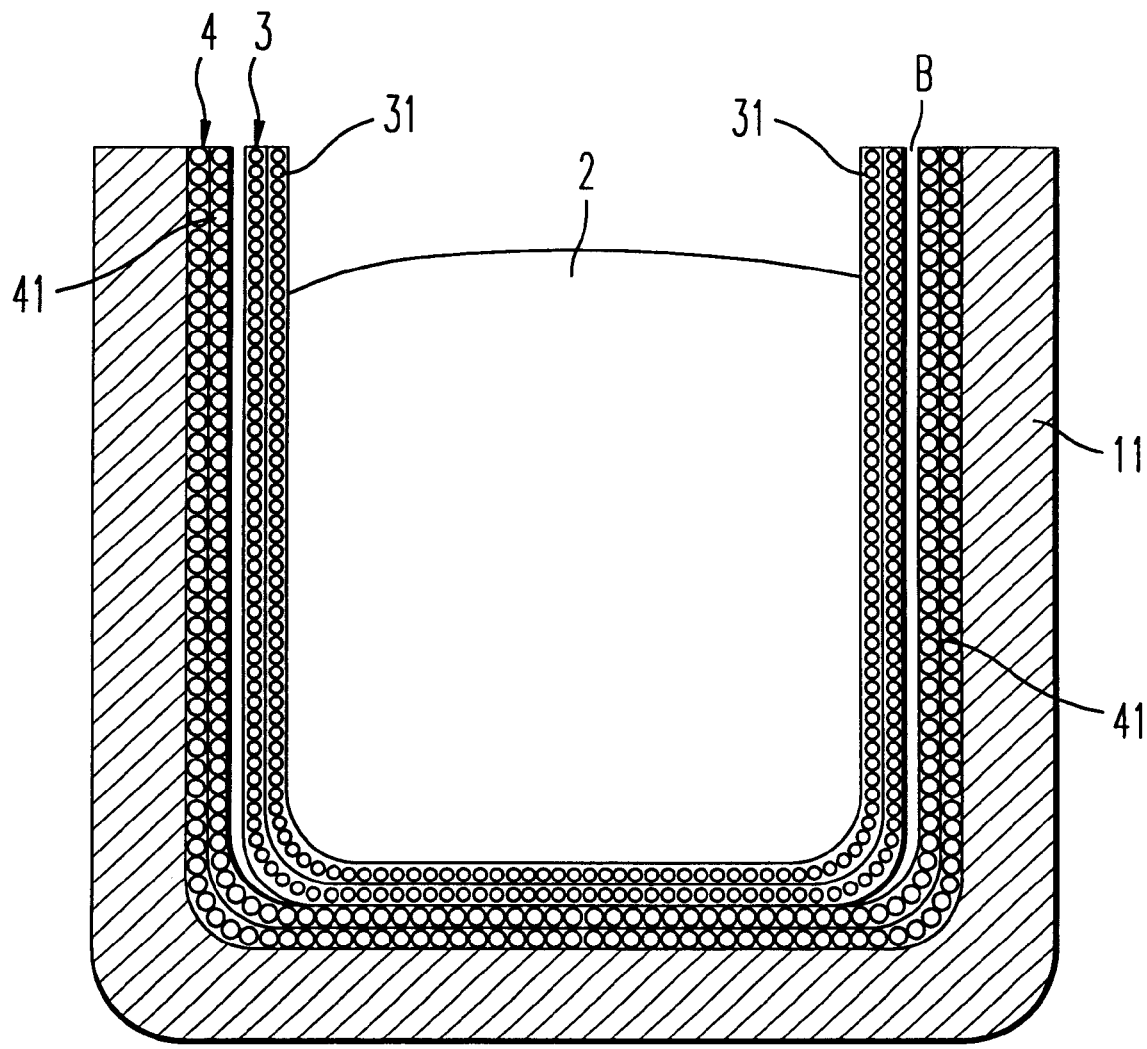
FIG. 8 denotes an illustrative cross section showing the solidified silicon ingot by cooling after injecting a molten silicon into the mold for producing a silicon ingot according to the present invention.
Figure 9:
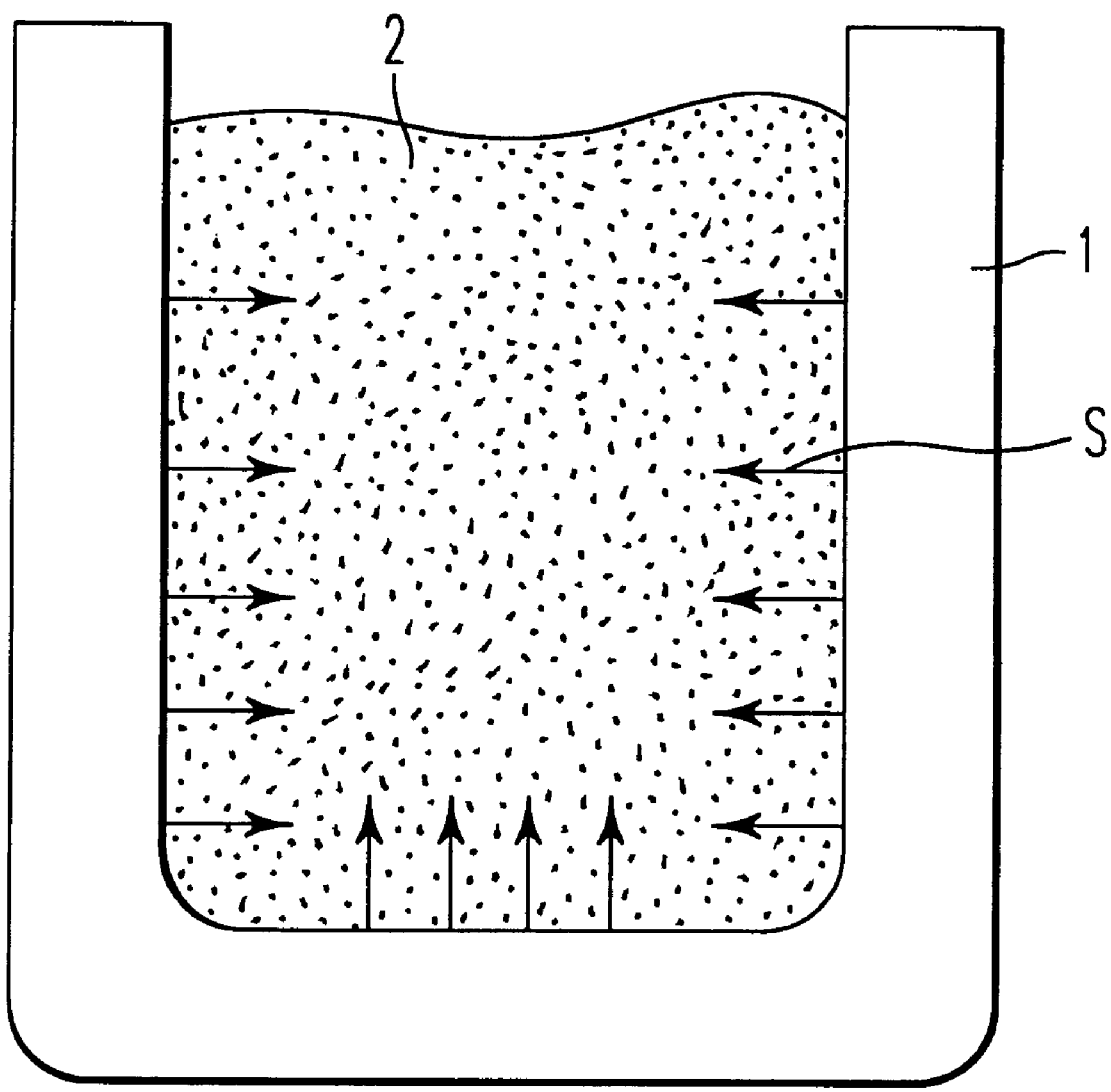
FIG. 9 denotes an illustrative cross section showing the solidified silicon ingot by cooling after injecting a molten silicon into the conventional mold for producing a silicon ingot.

The outer silica layer 4 containing the coarse fused silica sand 41 is readily released from the inner wall of the graphite mold for producing the silicon ingot having the inner silica layer 3 and outer silica layer 4 as described above. Accordingly, a peeled portion B appears as shown in the cross section in FIG. 8 by allowing the periphery of the silicon ingot 2 to be pulled by the inner wall of the mold when the solidified silicon ingot shrink(s by cooling after the molten silicon is poured into the mold for producing the silicon ingot, thereby leaving no inner stress in the silicon ingot 2.

Both the thicknesses of the inner silica layer and outer silica layer described above may be formed in the range as thin as 1.0–5.0 mm since the graphite mold serves as a reinforce core. A quartz mold may be used instead of the graphite mold.

Since the separated silica sand has smaller specific gravity than the molten silicon, the silica sand is discharged to outside as SiO gas by reacting with the molten silicon after being separated into the surface of the molten liquid, leaving no defects in the ingot behind.

The present invention based on the findings as described above provides a mold for producing a silicon ingot in which an inner silica layer containing fine fused silica sand with a particle size of 100–300 μm is formed on the inner surface of a graphite mold or quartz mold.

The present invention also provides a mold for producing a silicon ingot in which an inner silica layer containing at least one layer prepared by binding fused silica powder with a particle size of 100 μm or less with fine fused silica sand with a particle size of 100–300 AM is formed on the inner surface of a graphite mold or quartz mold.

The present invention also provides a mold for producing a silicon ingot in which an outer silica layer containing coarse fused silica sand with a particle size of 500–1500 μm is formed on the inner face of a graphite mold or a quartz mold, an inner silica layer containing fine fused silica sand with a particle size of 100–300 μm being formed on the inner side of the outer silica layer.

The present invention also provides a mold for producing a silicon ingot in which an outer silica layer containing at least one layer prepared by joining fused silica powder with a particle size of 100 μm or less and coarse fused silica sand with a particle size of 500–1500 μm with a silica binder is formed on the inner face of a graphite mold or quartz mold, an inner silica layer containing at least one layer prepared by joining fused silica powder with a particle size of 100 μm or less and fine fused silica sand with a particle size of 100–300 μm with a silica binder being formed on the outer silica layer.

The present invention al so provides a mold for producing a silicon ingot in which the wall face of the mold is tapered from the bottom toward the opening so that the opening area becomes larger than the bottom area.

The present invention also provides a mold for producing a silicon ingot in which the horizontal cross section of the mold has an inner space assuming a circle or a polygon.

The present invention also provides a mold for producing a silicon ingot in which the wall face of the mold is tapered from the bottom toward the opening so that the opening area becomes larger than the bottom area and the horizontal cross section of the mold has an inner space assuming a circle or a polygon.

The present invention provides a method for fabricating a mold for producing a silicon ingot, wherein a stucco layer is formed by sprinkling, followed by baking, fine fused silica sand with a particle size of 100–300 μm on the surface of a slurry layer after forming the slurry layer on the inner face of the mold by coating or spraying the slurry comprising fused silica powder with a particle size of 100 μm or less and colloidal silica on inside of a graphite mold or a quartz mold.

The present invention also provides a method for fabricating a mold for producing a silicon ingot comprising the steps of:

forming an outer stucco layer by sprinkling coarse fused silica sand with a particle size of 500–1500 μm on the surface of a slurry layer after forming the slurry layer on the inner lace of the mold by coating or spraying a slurry comprising fused silica powder with a particle size of 100 μm or less and colloidal silica on inside of a graphite mold or a quartz mold; and forming a stucco layer by sprinkling, followed by baking, fine fused silica sand with a particle size of 100–300 μm on the surface of the slurry layer after forming the slurry layer by further coating or spraying the slurry comprising fused silica powder with a particle size of 100 μm or less and colloidal silica on the outer stucco layer.

The present invention also provides a method for fabricating a mold for producing a silicon ingot in which the wall face of the graphite mold or the quartz mold is tapered from the bottom toward the opening so that the opening area becomes larger than the bottom area.

The present invention also provides a method for fabricating a mold for producing a silicon ingot in which the horizontal cross-section of the graphite mold or the quartz assumes a circle or a polygon.

The present invention also provides a method for fabricating a mold for producing a silicon ingot in which the inner wall face of the graphite mold or the quartz mold is tapered from the bottom toward the opening so that the opening area becomes larger than the bottom area and the horizontal cross-section of the graphite mold or the quartz mold assumes a circle or a polygon.

The inner silica layer of the mold for producing the silicon ingot according to the present invention can be formed by the steps comprising: forming a slurry layer on the inner surface of the quartz mold or graphite mold by coating or spraying a slurry comprising a fused silica powder with a mean particle size of 100 μm or less and colloidal silica; and applying one or a plurality of the stucco forming process by sprinkling followed by baking a fine fused silica sand with a particles size of 100–300 μm on the inner surface of the slurry layer to form a stucco layer. Forming the stucco layer on the slurry coating layer comprising fused the silica powder and silica slurry by spraying the fine fused silica sand allows defect generation that have been appeared by coating the conventional release agent to be avoided.

The particle size of the fused silica sand contained in the inner silica layer is limited to 100 μm or less in the mold for producing the silica ingot according to the present invention because, when the fused silica powder has a particle size as coarse as more than 100 μm, it becomes difficult to uniformly sprinkle the powder since the fused silica powder mixed with the colloidal silica is precipitated. Likewise, the particle size of the fine fused silica sand contained in the inner silica layer is limited within the range of 100–300 μm because, when the fine fused silica sand has a particle size as coarse as more than 300 μm, the surface roughness of the inner silica layer becomes too large while, when the fine fused silica sand has a particle size as fine as less than 100 μm the inner silica layer is insufficiently released from the mold as well as making it impossible to maintain a sufficient thickness.

The mold for producing the silicon ingot according to the present invention can be also fabricated through the steps comprising: forming a slurry layer by coating or spraying a slurry comprising a fused silica powder with a particle size of 100 μm or less and a colloidal silica on the inner face of the graphite mold or quartz mold; applying one or a plurality of stucco layer forming processes by sprinkling a coarse fused silica sand with a particle size of 500–1500 μm on the surface of the slurry layer; forming a slurry layer by coating or spraying a slurry comprising a fused silica powder with a particle size of 100 μm or less and a colloidal silica on the inner surface of the graphite mold on the stucco layer; applying one or a plurality of stucco layer forming processes by sprinkling, followed by baking, a fine fused silica sand with a particle size of 100–300 μm on the surface of the slurry layer. A thick outer silica layer can be formed by sprinkling the coarse fused silica sand, allowing a layer comprising the outer silica layer and inner silica layer to be formed within a short period of time along with allowing the inner silica layer to be thin. Although a thick and strong outer silica layer can be more simply formed as the particle size of the coarse fused silica sand to be sprinkled on the surface of the slurry layer is larger, the surface of the outer silica layer becomes too rough when the particle size of the coarse fused silica sand contained in the outer silica layer of the mold for producing the silicon ingot is as coarse as more than 1500 μm, adversely affecting smoothness of the inner silica layer. When the particle size of the coarse fused silica sand contained in the outer silica layer is as fine as less than 500 μm, on the other hand, a strong and thick outer silica layer can not be so easily formed.

EXAMPLES

Example 1

A wax mold with a diameter of 250 mm and a height of 100 mm was prepared. A binder comprising 30% by volume of super-fine fused silica powder with a particle size of 100 Å or less and a balance of water (referred to as a colloidal silica hereinafter) was also prepared to produce a slurry by mixing 200 parts of the colloidal silica with 200 parts of the fused silica powder with a particle size of 40 μm. The wax mold above was dipped into the slurry obtained, followed by lifting up, to form a slurry layer on the surface of the wax mold. Fine fused silica sand with a particle size of 150 μm was sprinkled on the surface of the slurry layer. This process was repeated three times to form a stucco layer, thereby forming an inner stucco layer comprising three layers with a combined thickness of 3 mm on the surface of the wax mold.

The wax mold on the surface of which the inner stucco layer was formed was dipped into the foregoing slurry again, followed by lifting up, to form a slurry layer on the surface of the inner stucco layer of the wax mold. Coarse fused silica sand with a particle size of 1000 μm was sprayed on the surface of the slurry layer and, by forming stucco layers by repeating the above process eight times, an outer stucco layer comprising eight layers with a combined thickness of 8 mm was formed on the surface of the wax mold.

Then, the wax mold whose inner surface was coated with the inner stucco layer and outer stucco layer was removed by allowing the wax to melt by heating at 100° C. The layered body obtained comprising the inner stucco layer and outer stucco layer was baked by keeping at a temperature of 800° C. for 2 hours, producing a mold for producing the silicon ingot according to the present invention comprising the inner silica layer and outer silica layer (referred to as a mold according to the present invention hereinafter).

A molten silicon held at a temperature of 1500° C. was poured into the mold 1 according to the present invention and was cooled at a cooling rate of 1° K./sec., producing a columnar silicon ingot by removing the ingot from the mold 1 according to the present invention. Presence of cracks due to stress and the amount of the remaining release agent on the surface of the columnar silicon ingot obtained were visually observed. Also, the polycrystalline silicon ingot obtained was sliced to produce a silicon substrate with a width of 150 mm and a length of 150 mm for use in the photovoltaic solar cell and the photovoltaic conversion efficiency of the silicon substrate was measured. The results of the observation and measurement are summarized in Table 1.

Example 2

A rectangular, column shaped wax mold with a length of 170 mm, a width of 170 mm and a height of 100 mm was prepared. The mold 2 according to the present invention was fabricated by the method as in Example 1 to produce a rectangular column shaped silicon ingot by the same method as in Example 1. Presence of cracks due to stress and the amount of the remaining release agent on the surface of the rectangular column shaped silicon ingot obtained were visually observed. Also, the polycrystalline silicon ingot obtained was sliced to produce a silicon substrate with a width of 150 mm and a length of 150 mm for use in the photovoltaic solar cell and the photovoltaic conversion efficiency of the silicon substrate was measured. The results of the observation and measurement are summarized in Table 1.

Example 3

A conical table shaped wax mold with a bottom diameter of 190 mm, a top diameter of 200 mm and a height of 100 mm whose side face is tapered at an angle of 3° was prepared. The mold 3 according to the present invention was fabricated using the conical table shaped wax mold by the method as in Example 1 to produce a conical table shaped silicon ingot by the same method as in Example 1. Presence of cracks due to stress and the amount of the remaining release agent on the surface of the rectangular column shaped silicon ingot obtained were visually observed. Also, the polycrystalline silicon ingot obtained was sliced to produce a silicon substrate with a width of 150 mm and a length of 150 mm for use in the photovoltaic solar cell and the photovoltaic conversion efficiency of the silicon substrate was measured. The results of the observation and measurement are summarized in Table 1.

Example 4

A graphite mold with an inner width of 170 mm and inner length of 170 mm, an outer width of 190 mm and outer length of 190 mm, and a depth of 150 mm was prepared. Colloidal silica comprising 30% by volume of super-fine fused silica powder and a balance of water was also prepared. A slurry was formed by mixing 100 parts of this colloidal silica with 200 parts of fused silica powder having a mean particle size of 40 μm. A slurry layer was formed by coating the inner face of the graphite mold with the slurry obtained, followed by forming a stucco layer by sprinkling the fine fused silica sand with a particle size of 150 μm on the surface of the slurry layer. This process was repeated three times and an inner silica layer with a combined thickness of 2 mm was formed on the inner face of the graphite mold by baking at a temperature of 800° C. for two hours, thereby fabricating the mold 4 according to the present invention.

A molten silicon kept at a temperature of 1500° C. was poured into the mold 4 according to the present invention to produce a polycrystalline silicon ingot. Presence of cracks due to stress and the amount of the remaining release agent on the surface of the polycrystalline silicon ingot obtained were visually observed. Also, the polycrystalline silicon ingot obtained was sliced to produce a silicon substrate with a width of 150 mm and a length of 150 mm for use in the photovoltaic solar cell and the photovoltaic conversion efficiency of the silicon substrate was measured. The results of the observation and measurement are summarized in Table 1.

Example 5

A slurry layer was formed using the graphite mold and slurry prepared in Example 4 by coating the inner face of the graphite mold with the slurry. The coarse fused silica sand with a particle size of 1000 μm was sprinkled on the surface of the slurry layer to form a stucco layer by repeating this sprinkling process twice. A slurry layer was additionally formed by coating the surface of the stucco layer with the slurry prepared in Example 4. The fine fused silica sand with a particle size of 150 μm was sprinkled on the slurry layer to form a stucco layer by repeating this sprinkling process twice, thereby forming a stucco layer containing coarse fused silica sand and fine fused silica sand. The graphite mold in which the stucco layer was formed was baked at a temperature of 800° C. for 8 hours in an inert gas atmosphere, fabricating the mold 5 according to the present invention by forming a layer comprising the inner silica layer and outer silica layer with a combined thickness of 3 mm on the inner face of the graphite mold.

A molten silicon kept at a temperature of 1500° C. was poured into the mold 5 according to the present invention and the mold was cooled at a cooling rate of 0.6° C./sec. to produce a polycrystalline silicon ingot. Presence of cracks due to stress and the amount of the remaining release agent on the surface of the polycrystalline silicon ingot obtained were visually observed. Also, the polycrystalline silicon ingot obtained was sliced to produce a silicon substrate with a width of 150 mm and a length of 150 mm for use in the photovoltaic solar cell and the photovoltaic conversion efficiency of the silicon substrate was measured. The results of the observation and measurement are summarized in Table 1.

Conventional Example 1

For the comparative purpose, a mold prepared by coating $Si_3N_4$ on the inner face of the graphite mold as prepared in Example 4 was used as a conventional graphite mold. A molten silicon kept at a temperature of 1500° C., the molten silicon prepared in Example 4, was poured into the conventional graphite mold and the mold was cooled at a cooling rate of 0.6° C./sec., producing a polycrystalline silicon ingot by removing the silicon ingot from the conventional graphite mold. Presence of cracks due to stress and the amount of the remaining, release agent on the surface of the polycrystalline silicon ingot obtained were visually observed. Also, the polycrystalline silicon ingot obtained was sliced to produce a silicon substrate with a width of 150 mm and a length of 150 mm for use in the photovoltaic solar cell and the photovoltaic conversion efficiency of the silicon substrate was measured. The results of the observation and measurement are summarized in Table 1.

Conventional Example 2

For the comparative purpose, a conventional quartz mold with an inner diameter of 240 mm, an outer diameter of 250 mm and a depth of 150 mm was prepared. A molten silicon kept at a temperature of 1500° C., the molten silicon prepared in Example 4, was poured into the mold and the mold was cooled at a cooling rate of 0.6° C./sec., producing a polycrystalline silicon ingot by removing the silicon ingot from the conventional type quartz mold. Presence of cracks due to stress and the amount of the remaining release agent on the surface of the polycrystalline silicon ingot obtained were visually observed. Also, the polycrystalline silicon ingot obtained was sliced to produce a silicon substrate with a width of 150 mm and a length of 150 mm for use in the photovoltaic solar cell and the photovoltaic conversion efficiency of the silicon substrate was measured. The results of the observation and measurement are summarized in Table 1.

TABLE 1

| Kind of mold | Stress Cracks | Residual release agent | Photovoltaic conversion efficiency (%) |
|---|---|---|---|
| Mold 1 of the present invention | None | None | 14.2 |
| Mold 2 of the present invention | None | None | 13.9 |
| Mold 3 of the present invention | None | None | 14.1 |
| Mold 4 of the present invention | None | None | 13.9 |
| Mold 5 of the present invention | None | None | 14.0 |

TABLE 1-continued

| Kind of mold | Stress Cracks | Residual release agent | Photovoltaic conversion efficiency (%) |
|---|---|---|---|
| Conventional graphite mold | None | Yes | 12.8 |
| Conventional quartz mold | Yes | None | 14.2 |

It is evident from the results summarized in Table 1 that the polycrystalline silicon ingot produced by using the molds 1–5 according to the present invention has a better photovoltaic conversion efficiency then the polycrystalline silicon ingot using the conventional graphite mold. Although the polycrystalline silicon ingot produced by using the molds 1–5 according to the present invention has a photovoltaic conversion efficiency comparable to the polycrystalline silicon ingot produced by using the conventional quartz mold, using the mold 1–5 according to the present invention allows production yield of the polycrystalline silicon ingot to be high, being free from the residual release agent.

As hitherto described, the present invention provides a mold for producing a silicon ingot with which a polycrystalline silicon ingot having a good photovoltaic conversion efficiency, being free from the residual release agent and generating no cracks due to stress can be produced. In addition, since a silicon ingot having not only a circular cross section but also a polygonal cross section is produced, a square or rectangular silicon substrate such as a silicon substrate for use in the photovoltaic solar cell can be produced with no waste of the silicon ingot, being effective for mass production and cost down of the silicon substrate for use in the photovoltaic solar cell.

The disclosure of Japanese priority application No. 10-045460 filed Feb. 26, 1998 and Japanese priority application No. 10-047449 filed Feb. 27, 1998 are hereby incorporated by reference into the present application.

Obviously, numerous modifications and variations of the present invention are possible in light of the above teachings. It is, therefore, to be understood that within the scope of the appended claims, the invention may be practiced otherwise than as specifically described herein.

What is claimed as new and is intended to be secured by letters patent is:

1. A mold for producing a silicon ingot having a layered structure comprising an inner silica layer containing at least one layer in which a fused silica powder with a particle size of 100 $\mu$m or less and a fine fused silica sand with a particle size of 100–300 $\mu$m is bonded with a silica binder, and an outer silica layer containing at least one layer in which a fused silica powder with a particle size of 100 $\mu$m or less and a coarse fused silica sand with a particle size of 500–1500 $\mu$m is bonded with a silica binder formed on the inner surface of a graphite mold or a quartz mold.

2. A mold for producing a silicon ingot, comprising:
 a mold body having a layered structure and having a bottom and a top provided with an opening and having an inner wall face having a shape which defines the shape of said silicon ingot produced, said layered structure comprising, an inner silica layer containing at least one layer in which a fused silica powder having, a particle size of 100 μm or less and a fine fused silica sand having a particle size of 100–300 μm is bonded with a silica binder, and an outer silica layer containing at least one layer in which a fused silica powder of a particle size of 100 μm or less and a course fuse silica sand of a particle size of 500–1500 μm is bonded with a silica binder.

3. The mold according to claim 2, wherein the inner wall face of the mold defines a shape for producing a silicon ingot which is tapered from the bottom of the mold toward the opening in the top of the mold so that the area of the opening becomes larger than the area of the bottom of the mold.

4. The mold according to claim 2, wherein the interior of the mold has a circular or a polygonal horizontal cross-section which defines the shape of the silicon ingot product produced.

5. The mold according to claim 3, wherein the interior of the mold has a circular or a polygonal horizontal cross-section which defines the shape of the silicon ingot product produced.

6. A mold for producing a silicon ingot, comprising:

a graphite or quartz mold body having a bottom and a top having an opening and having an inner wall face of a shape which defines the shape of the ingot produced, the interior wall face of the mold provided with an outer silica layer containing a coarse fused silica sand with a particle size of 500–1500 μm, and an inner silica layer on the inner side of said outer silica layer containing a fine fused silica sand having a particle size of 100–300 μm.

7. The mold according to claim 6, wherein the inner wall face of said mold is tapered from the bottom of the mold towards said opening so that the area of the opening becomes larger than the area of the bottom of the mold.

8. The mold according to claim 6, wherein the interior of the mold has a circular or a polygonal horizontal cross-section which defines the shape of the silicon ingot product produced.

9. The mold according to claim 7, wherein the interior of the mold has a circular or a polygonal horizontal cross-section which defines the shape of the silicon ingot product produced.

10. A mold for producing a silicon ingot, comprising:

a graphite or quartz mold body having a bottom and a top having an opening and having an inner wall face of a shape which defines the shape of the silicon ingot produced, said interior wall face being coated with an outer silica layer containing at least one layer prepared by joining fused silica powder having a particle size of 100 μm or less and coarse fused silica sand having a particle size of 500–1500 μm with a silica binder and an inner silica layer thereon containing at least one layer prepared by joining fused silica powder having a particle size of 100 μm or less and fine fused silica sand having a particle size of 100–300 μm with a silica binder.

11. The mold according to claim 10, wherein the inner wall face of said mold is tapered from the bottom of the mold towards said opening so that the area of the opening becomes larger than the area of the bottom of the mold.

12. The mold according to claim 10, wherein the interior of the mold has a circular or a polygonal horizontal cross-section which defines the shape of the silicon ingot product produced.

13. The mold according to claim 11, wherein the interior of the mold has a circular or a polygonal horizontal cross-section which defines the shape of the silicon ingot product produced.

* * * * *